United States Patent [19]

Kanda

[11] Patent Number: 5,032,725
[45] Date of Patent: Jul. 16, 1991

[54] FOCUSSING AN ELECTRON BEAM
[75] Inventor: Kimio Kanda, Katsuta, Japan
[73] Assignee: Hitachi, Ltd., Tokyo, Japan
[21] Appl. No.: 485,493
[22] Filed: Feb. 27, 1990
[30] Foreign Application Priority Data Mar. 10, 1989 [JP] Japan ................................ 1-56476

[51] Int. Cl.<sup>5</sup> .............................................. H01J 37/26
[52] U.S. Cl. ................................... 250/307; 250/310; 250/311
[58] Field of Search ...................... 250/307, 310, 311; 315/382

[56] References Cited

U.S. PATENT DOCUMENTS

| | | | |
|---|---|---|---|
| 4,071,759 | 1/1978 | Namae | 250/310 |
| 4,169,240 | 9/1979 | Anderson et al. | 315/382 |
| 4,199,681 | 4/1980 | Namae | 250/311 |
| 4,393,309 | 7/1983 | Norioka | 250/310 |
| 4,494,000 | 1/1985 | Shii | 250/311 |
| 4,514,634 | 4/1985 | Lawson | 250/311 |
| 4,724,319 | 2/1988 | Shirota | 250/311 |

FOREIGN PATENT DOCUMENTS 54-57949 5/1979 Japan .

Primary Examiner—Bruce C. Anderson
Attorney, Agent, or Firm—Antonelli, Terry, Stout & Kraus

[57] ABSTRACT

A beam of, e.g. an electron microscope, is focussed on a specimen and secondary electrons generated thereby are detected and analyzed to generate an output signal. That output signal is investigated for one magnification or scanning time of the beam over a range of foci to determine the optimum output value for that one magnification. This investigation is repeated for other magnifications to generate a series of optimum output values. The optimum of that series is then determined, and the electron microscope may then be operated for that specimen at the focus corresponding to the optimum of the series of optimum values. In this way, automatic focussing is provided which permits the optimum focus to be determined in dependence on the specimen.

31 Claims, 4 Drawing Sheets

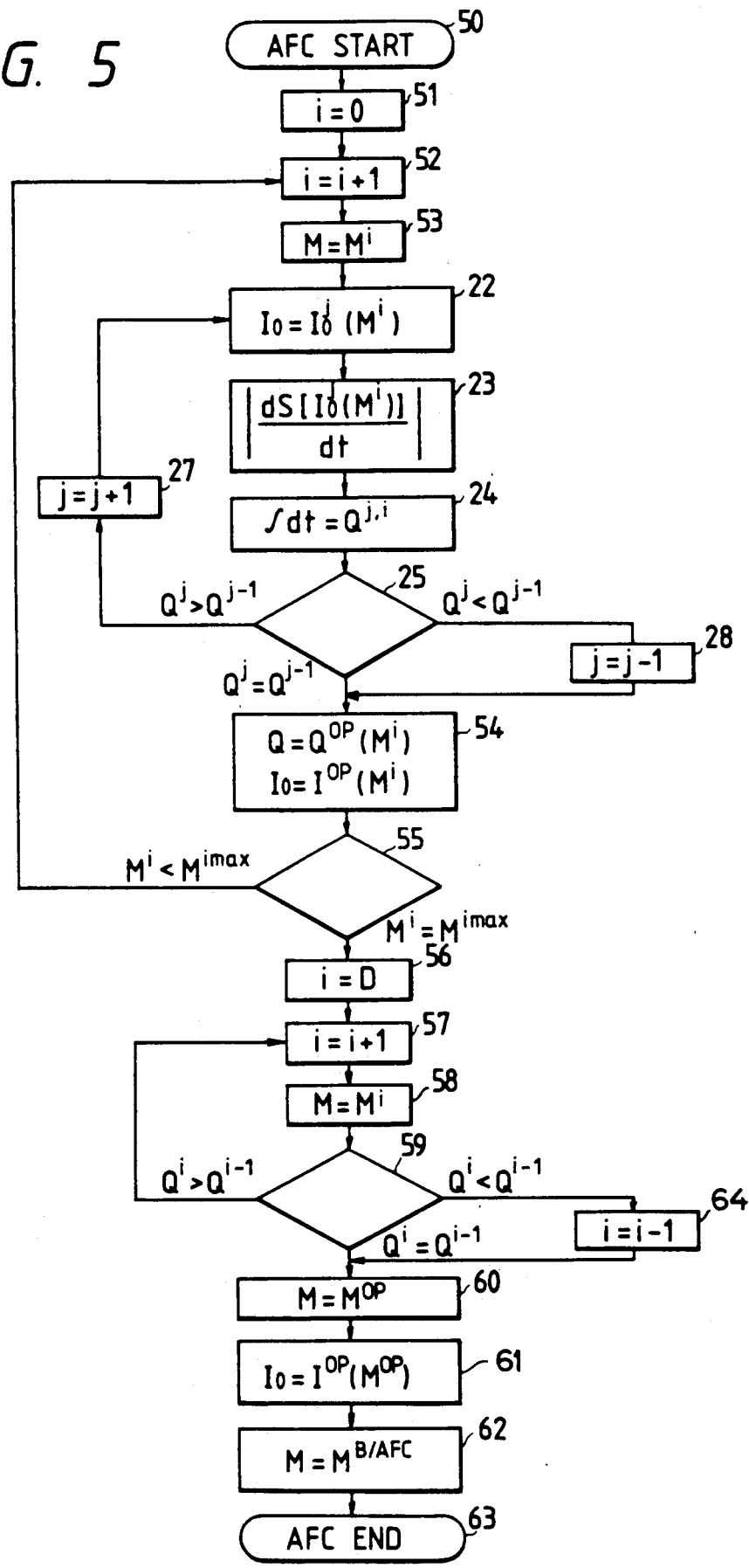

FOCUSSING AN ELECTRON BEAM

BACKGROUND OF THE INVENTION

1. Field of the Invention

The present invention relates to a method of focusing an electron beam on a specimen in an automatic way and is particularly, but not exclusively, concerned with the application of such an automatic focussing method to an electron microscope. The present invention also relates to a device for focussing an electron beam, to a method of operating an electron microscope, and to an electron microscope having an automatic focussing device.

2. Summary of the Prior Art

It is known to provide automatic focussing of the electron beam of an electron microscope. Standard automatic focussing methods involve investigation of the optimum focus for a fixed magnification, which fixed magnification is determined by the operator, and which normally corresponds to the magnification at which the operator wishes to investigate a specimen. In such a focussing method, the determination of the optimum focus at the fixed magnification is carried out on the basis of detection of secondary electrons emitted from the specimen when the electron beam of the electron microscope is incident on the specimen. A suitable detector can detect such secondary electrons, and by investigating the variation in the secondary electrons as the electron beam is scanned across the specimen, the optimum focus can be determined. In order to do this, the variation in the secondary electron signal is investigated for each of a plurality of current values, which current values are the values of the current controlling the electromagnetic condenser lens which determines the focussing of the electron beam. This way, a range of outputs is obtained, and the optimum one of those values can be selected.

In U.S. Pat. No. 4,199,681 it is proposed that an automatic scanning method be provided in which there is variation in the magnification. First, the optimum output of secondary electrons is investigated for a relatively low magnification. At that low magnification, the current to the condenser lens is varied stepwise, with a first interval between the steps, until the optimum value has been exceeded. Then, the magnification is increased, and the focussing current is again varied stepwise, in the opposite direction to the first variation, and with a second interval between the steps, which second interval is smaller than the first. Again, once the optimum output has been passed, the magnification is changed, the direction of the stepwise variation is changed, and the interval of that variation is again decreased. In this way, it is intended that the system will focus correctly.

SUMMARY OF THE INVENTION

The standard focusing method, at fixed magnification, fails to take into account that the magnification at which good focussing results can be obtained is not always the same. In U.S. Pat. No. 4,199,681, it is assumed that the best results are obtained at the highest magnification, but U.S. Pat. No. 4,199,681 assumes that it is necessary to start from a low magnification in order to produce a coarse focusing result, and then vary the magnification step-wise to obtain a more accurate focussing. U.S. Pat. No. 4,199,681 further assumes that the best focus is obtained at the highest magnification.

However, the inventors of the present invention have appreciated that the sample itself may have an effect on the magnification at which optimum focussing can be achieved. To understand this, consider the focussing operation. In an electron microscope, the magnification is determined by the ratio of the width of the picture generated, normally on a CRT (VDU), to the width of scanning of the electron beam. If the scan time is fixed, then for a given magnification, the scan width is also fixed. If, over the scanning width, the specimen has a detailed surface structure, then a large variation will be detected in the output of secondary electrons and it is that large variation which is used to detect the focus. Therefore, if the sample has a detailed surface structure, higher magnifications will provide better focussing. There is, however, an upper limit because if the scanning time is fixed, and the magnification is increased, this reduces the scanning width, and eventually a point will be reached in which the scanning width is too small to record significant variations in the surface structure. However, for a specimen with a relatively coarse surface structure, a large scan width will be necessary in order to provide a large variation in the output of secondary electrons. Therefore, the optimum magnification is different.

Thus, the present invention finds its origin in the realisation that the optimum magnification will vary with the sample, and the standard system, operating at fixed magnitudes, or the system of U.S. Pat. No. 4,199,681, in which it was assumed that the best results are necessarily achieved at higher magnifications, are not satisfactory. The present invention therefore proposes that the optimum output of secondary electrons be investigated for a range of focusses, and that investigation is repeated for a range of magnifications. Then, a series of "optimum" output values are obtained, and it is possible then to look for the optimum one of these "optimum" output values. Thus, the present invention proposes looking at that series so that an optimum magnification is sought.

Once that optimum magnification has been determined, subsequent use of the electron microscope with that specimen may be carried out using the focus determined at the optimum magnification.

As was mentioned above, for each magnification, the focus is varied, e.g. by varying the consender lens current in an electron microscope. Normally, this will be done as a series of steps, starting from a relatively low value. It is then desirable that the "height" of the steps is fixed, and also that the maximum and minimum values of the range over which the current is stepped is also fixed. This is because it is important that the system can adapt to a range of specimens. It should be noted that this fixing of the range and "height" of the current steps does not occur in U.S. Pat. No. 4,199,681.

The height and range of the current steps may be fixed automatically. In some cases, however, it is desirable that at least the range be adjustable by the operator of the electron microscope.

In a similar way, it is desirable that the maximum and minimum values of the range of magnifications is also fixed or adjustable by the operator.

For example, the operator may know from his experience that the likely optimum magnification for a particular specimen lies within a limited range of magnifications. Then, that range can be set, and therefore the method of the present invention need operate only over that limited range, thereby speeding up the determination of the optimum focussing current.

The above description has discussed the present invention on the basis that the magnification is varied. However, there is another way of carrying out the present invention, in which the magnification is fixed. Instead of varying the magnification, the scanning time or speed is varied. Since the fixing of the magnification fixes the scanning width, this increases the scanning velocity. Varying the scanning time or speed will produce a similar effect to varying the magnification.

With variation in magnification or in scanning time or speed, the result will be that a series of "optimum" outputs will be obtained, corresponding to optimum focussing, for different magnifications or scanning times or speeds. Preferably, the optimum output at one magnification, scanning time or speed is compared with the "optimum" output derived for the previous scanning time. Provided the former "optimum" value is more "optimum" than the latter, the rest of the invention continues with a further magnification or scanning time or speed. If, however, the former "optimum" output is worse than the latter optimum output, then the system knows that it has passed the true optimum, and that true optimum can subsequently be used.

However, there is an alternative way of determining the most optimum of the "optimum" outputs. A memory stores the "optimum" output for each magnification or scanning time. Then, after all the magnifications or scanning times in a range of such magnifications or scanning times or speeds have been investigated, the most optimum output can be determined.

As was mentioned above, the present invention is particularly applicable to an electron microscope, in which case the focussing current is the current which determines the focussing of the condenser lens or condenser lenses forming an condenser lens array.

In the above description, reference has been made to the optimum value of the output of secondary electrons from the sample. To determine that output, it is not enough merely to look for a maximum value, because the value at any point on the sample will vary because of surface structure of the sample. Instead, the differential of the output with time is obtained, and then that value is integrated over a predetermined range.

BRIEF DESCRIPTION OF THE DRAWINGS

An embodiment of the present invention will now be described in detail, by way of example, with reference to the accompanying drawings in which:

FIG. 5 shows a block diagram of another method of automatic focussing, being a second embodiment of the present invention.

DETAILED DESCRIPTION

Figure 1:
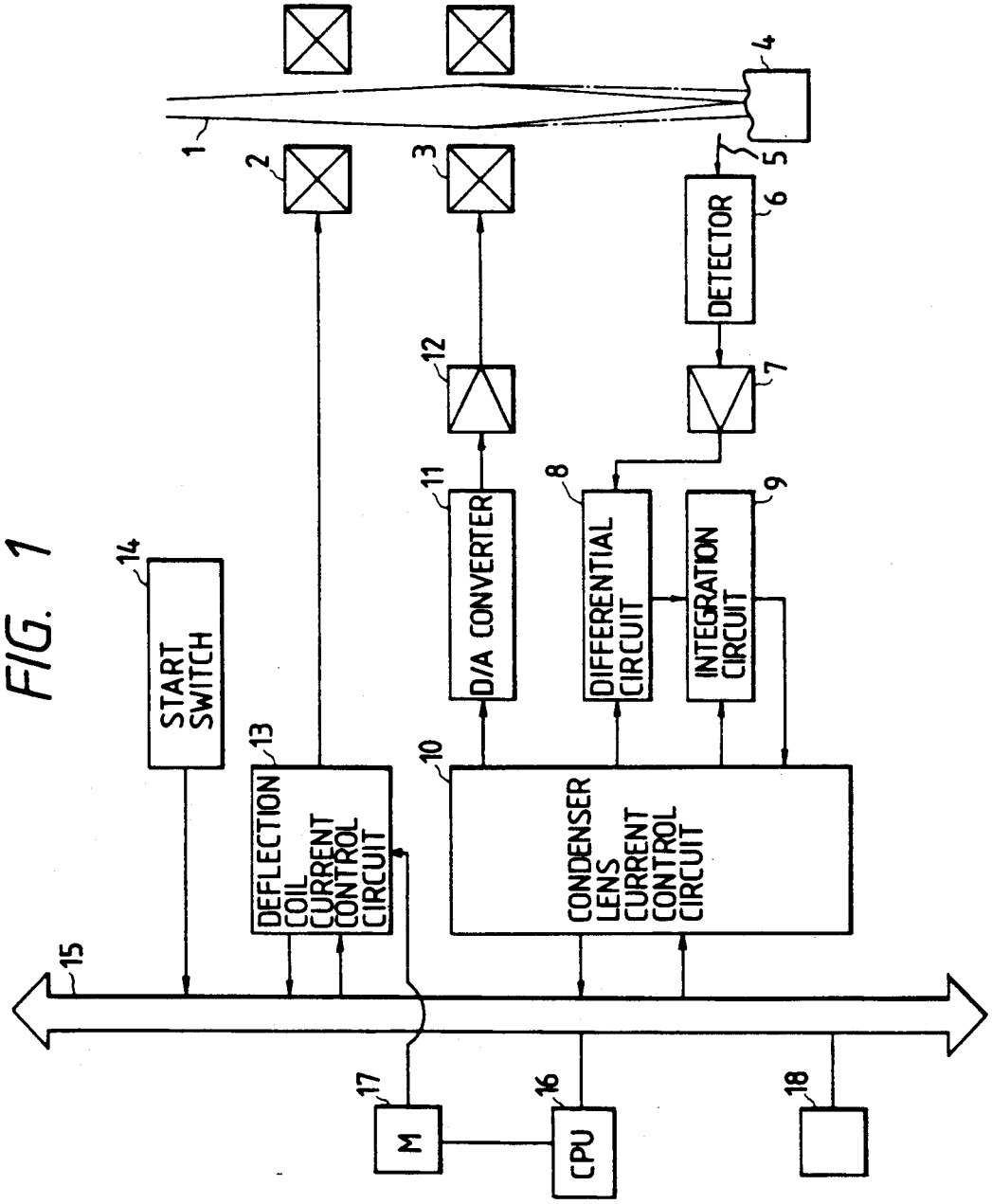
FIG. 1 is a block diagram of part of an electron microscope in which the present invention may be incorporated.

Referring first to FIG. 1, which is a schematic block diagram of part of an electron microscope, in which the present invention may be incorporated, an electron beam 1 is focussed on the surface of a specimen 4 by an electromagnetic condenser lens 3. As this occurs, the beam 1 is caused to scan over the surface of the specimen 4 due to the influence of a deflecting coil 2. The signal 5 (ordinarily, a secondary electron signal) generated from the specimen 4 by irradiation of the electron beam 1, is received by a detector 6 and converted to an electric signal, and displayed on a CRT (VDU) (not shown) via a video amplifier 7 which generates a video signal. The magnification of the displayed image is equal to the ratio of the scanning width of the image displayed on the CRT to the scanning width of the electron beam over the specimen 4. When the image which is displayed on the CRT screen is just in focus, the diameter of the electron beam spot on the specimen 4 is minimized. In the automatic focusing method of the present invention the spot diameter of the irradiated electron beam 1 on the specimen 4 is not minimized by manually changing the excitation current of the condenser lens 3. Instead of minimization by manually changing the focal length of the condenser lens 3, the device itself automatically accomplishes this.

In FIG. 1, the video output of the video amplifier 7 is fed to a differential circuit 8 which generates the differential of that output, and the modulus (absolute value) of that differential. Then, that differential is passed to an integration circuit 9 which determines the integral over a predetermined period of time of the modulus of the differential. It is the output of integration circuit 9 which indicates the optimum focussing. The output of the integration circuit 9 is fed to a condenser lens current control circuit 10, which outputs a signal to a D/A converter 11 and hence via a current amplifier 12 to the condenser lens 3. Also shown in FIG. 1 is a deflecting coil current control circuit 13 for controlling the deflecting coil 2, and a start switch circuit 14 which starts the automatic focussing operation. The condenser lens current control circuit 10, the deflecting coil current control circuit 13, and the starting switch circuit 14 are connected via a CPU bus 15 to a processing unit (CPU) 16 which controls the automatic focussing method. Also, as shown in FIG. 1, a memory 17 may store current values for use by the deflecting coil current control circuit and there may be an operator controllable input 18 for inputting a magnification range and/or a focussing range.

Figure 2:
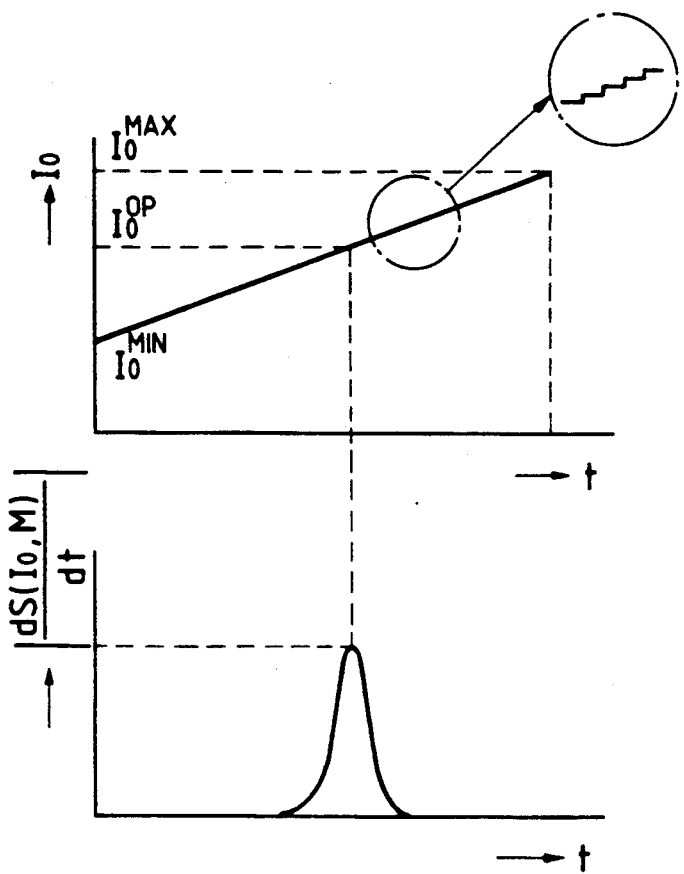
FIG. 2 is a graph showing the relationship between objective lens current and the absolute differential value of the output.

In automatic focussing, the excitation current of the condenser lens 3 is automatically searched for so as to maximize the high frequency components of the video signal. The fundamental idea underlying this procedure is shown in FIG. 2. By varying the condenser lens current $I_O$, stepwise with time t, from a minimum value $I_O MIN$ to a maximum value $I_O MAX$ (or conversely), the optimum condenser lens current $I_O OP$ is automatically searched for, so as to maximize the absolute differential value $|ds(I_O)/dt|$ of the video signal $S(I_O)$ shown as a function of the objective lens. However, the absolute differential value $|ds(I_O)/dt|$ of the video signal $S(I_O)$ has a changing momentary value so that it is extremely difficult to process, due to the influence of noise or S/N ratio.

Therefore, as shown in FIG. 1, the video signal from the video amplifier 7, which has a band pass filter, is changed to an absolute differential value by the differential circuit 8 which generates an absolute value output, which is integrated by the integration circuit 9, over a predetermined time interval. This value (the discrimination value) is determined as a function of the excitation current of the condenser lens 3, and the condenser lens current is automatically controlled using the D/A converter 11 and the current amplifier 12, so as to maximize the discrimination value. For automatic control, the condenser lens current control circuit 10 is used, which is connected to the CPU bus 15 and to the CPU 16 containing a suitable operation program. Automatic focusing is started by the automatic focusing start switch circuit 14. The Start/End control for the differential circuit 8 and the integration circuit 9 is triggered by a CPU command transmitted via the CPU bus 15, which is coupled with the condenser lens current control effected through the condenser lens current control circuit 10.

However, as discussed above, a problem occurs due to the fineness of the specimen surface structure. Since conventional automatic focusing is carried out only on the basis of the video signal by scanning the electron beam 1 over the specimen 4, with the magnification set by an operator, there is failure of automatic focussing if there are unsuitable relative relationships between the surface structure fineness of the specimen 4 and the scanning width of the electron beam 1 on the specimen 4. This is because, in order to detect the optimum condenser lens current, with a good S/N ratio and to detect that current in a short time, using the discrimination value $\int |ds(I_O)/dt| dt$ which is obtained from the video signal $S(I_O)$, a band pass filter having a comparatively narrow band is combined with the video amplifier 7. For example, when conventional automatic focusing is carried out with a specimen such as a photoresist pattern formed on a silicon wafer, the automatic focussing operation works well only within a high magnification domain, and does not work well within a low magnification domain. This is because the scanning time of the electron beam 1 over the specimen 4 is constant. Therefore, if the scanning width is large (that is, if magnification is low), the effective scanning speed over the specimen is increased, and then the video signal frequency component corresponding to the optimum objective lens current could not be detected as the maximum value of the discrimination value $\int |ds(I_O)/dt| dt$.

This invention proposes that the scanning electron microscope, or similar apparatus, has an automatic focusing function to overcome these said defects. In FIG. 1, since the control system of the deflecting coil current control circuit 13 which controls the magnification with respect to the deflecting coil 2 (that is, the electron beam scanning width over the specimen 4) is included in an algorithm for automatic focussing, the problem underlying the present invention may be resolved.

Figure 3:
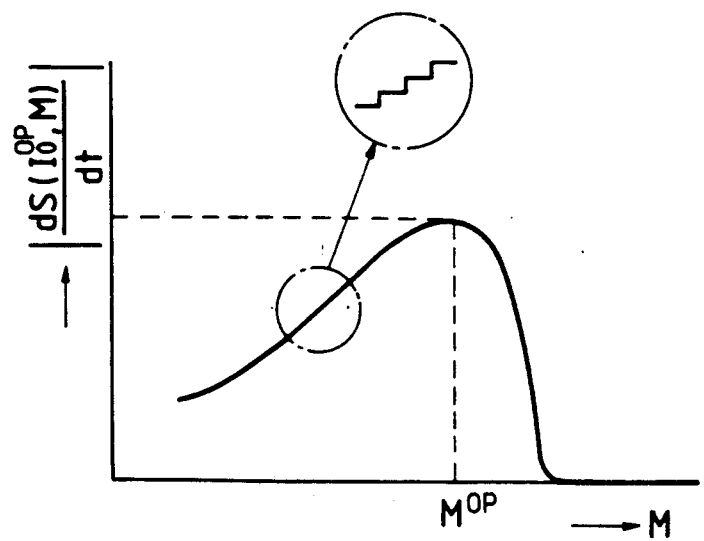
FIG. 3 is a graph showing the relationship between the magnification and the absolute differential value of the output.

The operation of the embodiment shown in FIG. 1 will now be explained referring to FIG. 2 and FIG. 3. At first, with the arrangement shown in FIG. 1, the video signal is a function $S(I_O,M)$ of both of the conductor lens current $I_O$ and the magnification M.

If the magnification is fixed at a predetermined value, as in a conventional automatic focussing system, then the maximum value of the discrimination value $$\int |ds(I_O,M_j)/dt| dt$$

is obtained. The condenser lens current $I_O$ is then fixed at a value (actually, a provisional optimum value $I_OOP(i)$) which corresponds to the maximum value obtained as discussed. Then the magnification M is changed so that a maximum discrimination value is obtained as shown in FIG. 3.

With such an operation, when the operator determines, in advance, the variable width and steps of magnification in accordance with the specimen subject to microscopic analysis, the search of the maximum discrimination value may be accomplished effectively and in a short time. For instance, if automatic focusing is carried out on a 1 μm wide photoresist pattern formed on a silicon wafer, and if the scanning electron microscope which uses an electric field emission electron gun is used, 20,000 times, 30,000 times, and 40,000 times are enough for the variable width and steps of the magnification. In any case, it is desirable that the device is constructed so as to make is possible to choose many kinds of variable width and steps of the magnification.

Then the magnification at the optimum magnification thus obtained is fixed and automatic focusing is carried out. By moving the provisional optimum value of the objective lens current $I_OOP(i)$ obtained previously a small amount toward the plus side and toward the minus side to obtain respective discrimination values, the true optimum value $I_O$ may be determined. The condenser lens current is fixed on this value. When, by these operations, the automatic focussing is complete, only the magnification is returned automatically to the former image observing magnification $M^{B/AFC}$ set prior to automatic focusing, the automatic focusing at the magnification $M^{B/AFC}$ set by an operator is effected to the satisfaction of the operator. A flow chart according of the operation of this embodiment of the present invention is shown in FIG. 4.

Figure 4:
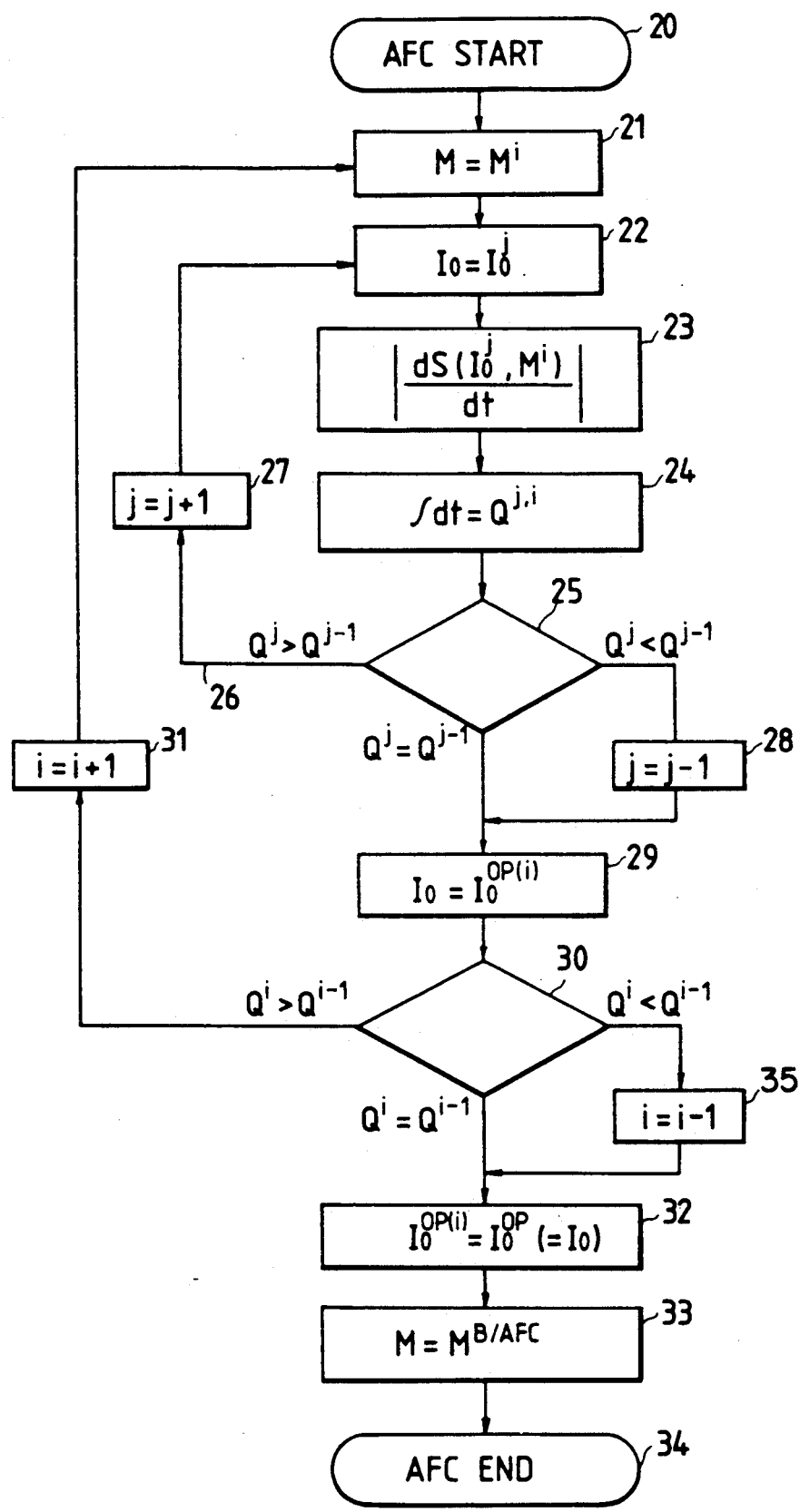
FIG. 4 shows a flow diagram of a method of automatic focussing, being a first embodiment of the present invention.

FIG. 4 illustrates steps in an automatic focussing method according to a first embodiment of the present invention. In FIG. 4 operation starts at a first step 20, and the first stage in the method is to set a magnification M to an initial value $M^i$, at step 21. Then, the current $I_O$ for controlling the condenser lens 3 is set to an initial value $I_{O^j}$ at step 22. Using the magnification $M^i$ and the current $I_{O^j}$, the electron beam 1 is scanned on a sample 4 so that at step 23, the absolute value of the integration of the video current S is determined, and this is integrated at step 24 to generate a first output $Q^{ji}$.

Then, at step 25, a comparison operation is carried out. For the initial values as described above, there will be no earlier value with which to compare, and then processing will necessarily pass via path 26, in which the value of j is increased by 1, to step 27, and this new value of j is then used for a new value of $I_O$. With that new value, step 24 will then produce a new value of Q and this new value of Q can be compared with the first value of Q. If there is an increase in the value of Q then processing again passes via step 27. Thus, there will be iteration of steps 22, 23, 24, 25, and 27 until a value of Q is obtained which is less than or equal to the previous value. Where it is less than the previous value, j is decremented, at step 28, and thus an optimum value of $I^O$, ($I_O(1)$) is obtained. If the value of Q is equal to the previous value, it can be used directly. This is the optimum value for the magnification $M^i$ and is illustrated at step 29.

The next step, step 30 is a further comparison step. If the magnification $M^i$ is the first magnification used then processing immediately passes from step 30 to step 31 in which the value of i is increased by 1. For subsequent values of i the value of Q obtained for $I_O$OP(i) at magnification $M^i$ can be compared with the corresponding value of Q for the previous magnification value. If the new value of Q is greater than the previous value, again processing passes from step 30 to step 31. Thus, there will be a further iteration loop through steps 29, 30, 31, 21, and each of these iteration loops has a sub iteration loop of steps 22, 23, 24, 25 and 27. If, for a given magnification $M_i$ the value of Q obtained ($Q^i$) is less than or equal to the previous value, then iteration halts. If the value of $Q^i$ is less than the previous value, i is decreased by one as shown in step 35, and at step 32 the optimum value $I_O$OP is obtained, being the optimum of the optimum values of $I_O$OP (i) for the magnifications. Again if the optimum value is equal to the previous optimum it can be used directly. The optimum magnification is also obtained in step 33 and the automatic focussing ends at step 34. The optimum value of the current IO to the condenser lens 3 is thus obtained.

FIG. 5 shows a second embodiment of a method according to the present invention. This method differs from that of FIG. 4 in that there is a range of magnifications, and measurement is carried out for all of those magnifications. Initially, therefore, after the start of the operation at step 50, i is set to one below the minimum value at step 51, and then to the minimum at step 52. This minimum value at step 52 generates a first magnification value at step 53. Then, for that magnification, the video current is investigated for a range of objective lens currents. This is the same operation as was carried out in FIG. 4, and the same reference numerals are used, being steps 22, 23, 24, 25, 27 and 28. However, then, at step 54, the optimum values of Q and $I_O$ and the corresponding magnification are stored in a memory. Then, step 55 checks if the maximum magnification has been reached. If it has not, processing returns to step 52, to increment the magnification by one at step 53, and iteration then occurs. This iteration is repeated until the maximum value of the magnification is reached. At this point, a series of values of Q and corresponding values of $I_O$ have been obtained for each magnification. Then, at step 56, i is reset to the value at step 51, and then incremented by one as at step 52, shown by step 57. The corresponding magnification and value of Q are then obtained at step 58, and the value of Q investigated at step 59. For the initial value, there will be no earlier value for comparison, but for subsequent values of i, step 59 will involve comparison with the immediately preceding value from the series of iterations through steps 57, 58, and 59. Thus, step 59 is operating a similar way to step 30 in FIG. 4. When, for an increment in i, it is found that Q decreases, an optimum value of M has been found, and processing passes to step 60, possibly via step 64, in a similar way to steps 35 and 32 in FIG. 4. With that optimum value of M, the corresponding optimum value of $I_O$ can be obtained in step 61, then steps 62 and 63 correspond to steps 33 and 34 in FIG. 4. Thus, again, the most optimum value of the optimum values of $I_O$ is obtained.

Subsequently, in measurements on the specimen, the most optimum value of the optimum values of $I_O$ is used. Of course, if the specimen is changed, the automatic focussing must be repeated.

The start of the automatic focussing may be manually initiated with the start switch circuit 14, to cause automatic focussing as in the embodiment of the present invention discussed above with reference to FIG. 1, or may automatically be initiated after the operator change a field for the microscopic inspection. Of course, it is also possible for the movement of the field for the microscopic inspection to be performed on the basis of a pre-programmed command.

The above description of embodiments of the present invention has been based on the assumption that it is the magnification which is varied. However, as mentioned earlier, it is also possible to operate the present invention with a variation in scanning time. In this case, it is an initial scanning time which is set at steps 21 and 53 in FIGS. 4 and 5 respectively, and it is the scanning time which is changed in the iteration process from steps 30 and 55 respectively. Otherwise, carrying out the method of the present invention using scanning time may be exactly as described above. Of course, if the magnification is varied, the scanning time should be fixed and vice versa.

According to the present invention, efficient automatic focusing may be carried out independently of the fineness of the specimen surface structure and the magnification which is set for the image observation, and the automatic focusing is carried out surely and effectively.

What is claimed is:

1. A method of automatically focussing a charged particle beam on a specimen in which incidence of the beam on the specimen causes an output signal to be generated, the method comprising the steps of:
    (a) selecting a magnification for the beam from a plurality of magnifications;
    (b) selecting a focus for the beam from a plurality of foci;
    (c) detecting the output signal at the selected magnification and the selected focus;
    (d) repeating steps (b) and (c) for others of said plurality of foci to determine a focus of said plurality of foci which corresponds to an optimum value of said detected output signal for said selected magnification; and
    (e) repeating steps (a) to (d) for others of said plurality of magnifications and comparing a resulting plurality of optimum values corresponding to said plurality of magnifications with each other, thereby to determine an optimum one of said plurality of optimum values.

2. A method according to claim 1, wherein step (c) includes scanning said beam across said specimen for a fixed scanning time.

3. A method according to claim 1, wherein the incidence of the beam on the specimen is influenced by at least one electromagnetic lens, the action of said at least one electromagnetic lens on said beam being determined by a focussing current, wherein each of said plurality of foci is associated with a corresponding focussing current, and wherein step (b) includes selecting the focussing current corresponding to the one focus.

4. A method according to claim 3, wherein the focussing currents corresponding to said plurality of foci define a range of focussing currents, and wherein maximum and minimum focussing currents of said range of focussing currents are fixed for each repetition of steps (a) to (d).

5. A method according to claim 4, wherein said maximum and minimum focussing currents are fixed automatically.

6. A method according to claim 4, wherein the maximum and minimum focussing currents are adjustable by an operator prior to step (b).

7. A method according to claim 3, wherein said focussing currents corresponding to said plurality of foci form a sequence of focussing currents, wherein adjacent focussing currents in said sequence of focussing currents differ from each other by a fixed amount.

8. A method according to claim 1, wherein said plurality of magnifications define a range of magnifications.

9. A method according to claim 8, wherein maximum and minimum magnifications of said range of magnifications are fixed automatically.

10. A method according to claim 8, wherein maximum and minimum magnifications of said range of magnifications are adjustable by an operator.

11. A method according to claim 1, wherein step (e) includes comparing the optimum value for each one of the repetitions of steps (a) to (d) with the optimum value for the immediately preceding repetition of steps (a) to (d), and halting step (e) when the optimum value for one of said repetitions is less than the optimum value for the immediately preceding repetition.

12. A method according to claim 1, wherein step (e) includes storing the optimum value and the corresponding focus for each repetition of steps (a) to (d), and comparing the stored optimum values with each other after steps (a) to (d) have been repeated for all of said plurality of magnifications.

13. A method of automatically focussing a charged particle beam in which said beam is caused to be incident on a specimen by at least one electromagnetic lens and an output signal generated from said specimen by the incidence of said beam on said specimen is detected, the action of said at least one electromagnetic lens on said beam being determined by a focussing current, the method comprising the steps of:
(a) selecting a magnification for the beam from a plurality of magnifications;
(b) varying the focussing current over a range of focussing currents and detecting said output signal at the selected magnification for each focussing current in said range of focussing currents to determine which of the focussing currents in said range of focussing currents corresponds to an optimum value of said detected output signal; and
(c) repeating steps (a) and (b) for each magnification of said plurality of magnifications, thereby to determine a plurality of optimum values of said detected output signal, said plurality of optimum values corresponding to said plurality of magnifications;
wherein maximum and minimum focussing currents of said range of focussing currents are fixed for each repetition of steps (a) and (b).

14. A method according to claim 13, wherein said maximum and minimum focussing currents are fixed automatically.

15. A method according to claim 13, wherein said maximum and minimum focussing currents are adjustable by an operator prior to step (b).

16. A method of automatically focussing a charged particle beam in which said beam is caused to be incident on a specimen by at least one electromagnetic lens and an output signal generated from said specimen by the incidence of said beam on said specimen is detected, the action of said at least one electromagnetic lens on said beam being determined by a focussing current, the method comprising the steps of:
(a) selecting a magnification for the beam from a plurality of magnifications;
(b) varying the focussing current over a range of focussing currents and detecting said output signal at the selected magnification for each focussing current in said range of focussing currents to determine which of the focussing currents in said range of focussing currents corresponds to an optimum value of said detected output signal; and
(c) repeating steps (a) and (b) for each magnification of said plurality of magnifications, thereby to determine a plurality of optimum values of said detected output signal, said plurality of optimum values corresponding to said plurality of magnifications;
wherein the focussing currents in said range of focussing currents form a sequence of focussing currents, wherein adjacent focussing currents in said sequence of focussing currents differ from each other by a fixed amount.

17. A method of operating an electron microscope in which an electron beam is focussed on a specimen by at least one condenser lens in response to a focussing current and an output signal generated from said specimen by incidence of said beam on said specimen is detected, the method comprising the steps of:
(a) determining an optimum magnification for the beam by detecting a variation in the detected output signal over a range of magnifications for the beam by varying the focussing current over a range of focussing currents for each magnification in the range of magnifications, wherein the optimum magnification is a magnification in the range of magnifications which produces an optimum value of the detected output signal; and
(b) subsequently operating said electron microscope to examine said specimen using a focussing current corresponding to said optimum value of said detected output signal.

18. A method of operating a scanning electron microscope in which an electron beam is focussed on a specimen by at least one condenser lens, incidence of the beam on the specimen generating an output signal, the method comprising the step of:
(1) automatically focussing the electron beam on the specimen;
wherein the step of automatically focussing the electron beam includes the steps of:
(a) selecting a magnification for the beam from a plurality of magnifications;
(b) selecting a focus for the beam from a plurality of foci;
(c) detecting the output signal at the selected magnification and the selected focus;
(d) repeating steps (b) and (c) for others of said plurality of foci to determine a focus of said plurality of foci which corresponds to an optimum value of said detected output signal for said selected magnification; and
(e) repeating steps (a) to (d) for others of said plurality of magnifications and comparing a resulting plurality of optimum values corresponding to said plurality of magnifications with each other, thereby to determine an optimum one of said plurality of optimum values;
the method further comprising the step of:
(2) subsequently operating said scanning electron microscope to examine said specimen, with the at least one condenser lens being set to the focus corresponding to said optimum one of said plurality of optimum values.

19. A device for focussing a charged particle beam on a specimen, comprising:

magnification selection means for selecting a magnification for said beam from a plurality of magnifications;

focus selection means for selecting a focus for said beam from a plurality of foci;

means for causing said beam to be incident on said specimen at the selected magnification and the selected focus;

detection means for detecting an output signal generated by the incidence of said beam on said specimen;

controller means for controlling said magnification selection means and said focus selection means so as to cause said detection means to detect said output signal at each focus of said plurality of foci at each magnification of said plurality of magnifications;

means for determining an optimum one of the detected output signals for each magnification of said plurality of magnifications; and means for comparing the optimum ones of the detected output signals with each other.

20. A device according to claim 19, wherein said means for comparing determines an optimum one of the optimum ones of the detected output signals.

21. A device according to claim 19, wherein said magnification selection means comprises operator-adjustable means for setting maximum and minimum magnifications of said plurality of magnifications.

22. A device according to claim 19, further comprising means for storing each of the optimum ones of the detected output signals.

23. An electron microscope for examining a specimen, comprising:

means for generating an electron beam;

detection means for detecting an output signal generated from said specimen by incidence of said electron beam on said specimen; and an automatic focussing device for focussing said beam on said specimen, said automatic focussing device comprising:

magnification selection means for selecting a magnification for said beam from a plurality of magnifications;

focus selection means for selecting a focus for said beam from a plurality of foci;

at least one condenser lens for focussing said beam on said specimen at the selected magnification and the selected focus;

controller means for controlling said magnification selection means and said focus selection means so as to cause said detection means to detect said output signal at each focus of said plurality of foci at each magnification of said plurality of magnifications;

means for determining an optimum one of the detected output signals for each magnification of said plurality of magnifications; and means for comparing the optimum ones of the detected output signals with each other to determine an optimum one of the optimum ones of the detected output signals.

24. A method of automatically focussing a charged particle beam on a specimen in which the beam is scanned across the specimen and incidence of the beam on the specimen causes an output signal to be generated, the method comprising the steps of:

(a) selecting a scanning time for the beam from a plurality of scanning times;

(b) selecting a focus for the beam from a plurality of foci;

(c) detecting the output signal at the selected scanning time and the selected focus;

(d) repeating steps (b) and (c) for others of said plurality of foci to determine a focus of said plurality of foci which corresponds to an optimum value of said detected output signal for said selected scanning time; and (e) repeating steps (a) to (d) for others of said plurality of scanning times and comparing the resulting plurality of optimum values corresponding to said plurality of scanning times with each other, thereby to determine an optimum one of said plurality of optimum values.

25. A method of automatically focussing a charged particle beam in which said beam is caused to be incident on a specimen by at least one electromagnetic lens, said beam is scanned across said specimen, and an output signal generated from said specimen by the incidence of said beam on said specimen is detected, the action of said at least one electromagnetic lens on said beam being determined by a focussing current, the method comprising the steps of:

(a) selecting a scanning time for the beam from a plurality of scanning times;

(b) varying the focussing current over a range of focussing currents and detecting said output signal at the selected scanning time for each focussing current in said range of focussing currents to determine which of the focussing currents in said range of focussing currents corresponds to an optimum value of said detected output signal; and (c) repeating steps (a) and (b) for each scanning time of said plurality of scanning times, thereby to determine a plurality of optimum values of said detected output signal, said plurality of optimum values corresponding to said plurality of scanning times;

wherein maximum and minimum scanning times of said range of scanning times are fixed for each repetition of step (b).

26. A method of automatically focussing a charged particle beam in which said beam is caused to be incident on a specimen by at least one electromagnetic lens, said beam is scanned across said specimen, and an output signal generated from said specimen by the incidence of said beam on said specimen is detected, the action of said at least one electromagnetic lens on said beam being determined by a focussing current, the method comprising the steps of:

(a) selecting a scanning time for the beam from a plurality of scanning times;

(b) varying the focussing current over a range of focussing currents and detecting said output signal at the selected scanning time for each focussing current in said range of focussing currents to determine which of the focussing currents in said range of focussing currents corresponds to an optimum value of said detected output signal;

(c) repeating steps (a) and (b) for each scanning time of said plurality of scanning times, thereby to determine a plurality of optimum values of said detected output signal, said plurality of optimum values corresponding to said plurality of scanning times;

wherein the focussing currents in said range of focussing currents form a sequence of focussing currents, wherein adjacent focussing currents in said sequence of focussing currents differ from each other by a fixed amount.

27. A method of operating a scanning electron microscope in which an electron beam is focussed on a specimen by at least one condenser lens in response to a focussing current, the beam is scanned over said specimen, and an output signal generated from said specimen by incidence of said beam on said specimen is detected, the method comprising the steps of:
   (a) determining an optimum scanning time for the beam by detecting a variation in the detected output signal over a range of scanning times for the beam by varying the focussing current over a range of focussing currents for each scanning time in the range of scanning times, wherein the optimum scanning time is a scanning time in the range of scanning times which produces an optimum value of the detected output signal; and
   (b) subsequently operating said scanning electron microscope to examine said specimen using a focussing current corresponding to said optimum value of said detected output signal.

28. A method of automatically focussing a charged particle beam on a specimen in which the beam is scanned across the specimen and incidence of the beam on the specimen causes an output signal to be generated, the method comprising the steps of:
   (a) selecting a scanning speed for the beam from a plurality of scanning speeds;
   (b) selecting a focus for the beam from a plurality of foci;
   (c) detecting the output signal at the selected scanning speed and the selected focus;
   (d) repeating steps (b) and (c) for others of said plurality of foci to determine a focus of said plurality of foci which corresponds to an optimum value of said detected output signal for said selected scanning speed; and
   (e) repeating steps (a) to (d) for others of said plurality of scanning speeds and comparing the resulting plurality of optimum values corresponding to said plurality of scanning speeds with each other, thereby to determine an optimum one of said plurality of optimum values.

29. A method of automatically focussing a charged particle beam in which said beam is caused to be incident on a specimen by at least one electromagnetic lens, said beam is scanned across said specimen, and an output signal generated from said specimen by the incidence of said beam on said specimen is detected, the action of said at least one electromagnetic lens on said beam being determined by a focussing current, the method comprising the steps of:
   (a) selecting a scanning speed for the beam from a plurality of scanning speeds;
   (b) varying the focussing current over a range of focussing currents and detecting said output signal at the selected scanning speed for each focussing current in said range of focussing currents to determine which of the focussing currents in said range of focussing currents corresponds to an optimum value of said detected output signal; and
   (c) repeating steps (a) and (b) for each scanning speed of said plurality of scanning speeds, thereby to determine a plurality of optimum values of said detected output signal, said plurality of optimum values corresponding to said plurality of scanning speeds;
wherein maximum and minimum focussing currents of said range of focussing currents are fixed for each repetition of step (b).

30. A method of automatically focussing a charged particle beam in which said beam is caused to be incident on a specimen by at least one electromagnetic lens, said beam is scanned over said speciment, and an output signal generated from said specimen by the incidence of said beam on said specimen is detected, the action of said at least one electromagnetic lens on said beam being determined by a focussing current, the method comprising the steps of:
   (a) selecting a scanning speed for the beam from a plurality of scanning speeds;
   (b) varying the focussing current over a range of focussing currents and detecting said output signal at the selected scanning speed for each focussing current in said range of focussing currents to determine which of the focussing currents in said range of focussing currents corresponds to an optimum value of said detected output signal;
   (c) repeating steps (a) and (b) for each scanning speed of said plurality of scanning speeds, thereby to determine a plurality of optimum values of said detected output signal, said plurality of optimum values corresponding to said plurality of scanning speeds;
wherein the focussing currents in said range of focussing currents form a sequence of focussing currents, wherein adjacent focussing currents in said sequence of focussing currents differ from each other by a fixed amount.

31. A method of operating a scanning electron microscope in which an electron beam is focussed on a specimen by at least one condenser lens in response to a focussing current, the beam is scanned over said specimen, and an output signal generated from said specimen by incidence of said beam on said specimen is detected, the method comprising the steps of:
   (a) determining an optimum scanning speed for the beam by detecting a variation in the detected output signal over a range of scanning speeds for the beam by varying the focussing current over a range of focussing currents for each scanning speed in the range of scanning speeds, wherein the optimum scanning speed is a scanning speed in the range of scanning speed which produces an optimum value of the detected output signal; and
   (b) subsequently operating said scanning electron microscope to examine said specimen using a focussing current corresponding to said optimum value of said detected output signal.

* * * * *